(12) United States Patent
Zhu et al.

(10) Patent No.: US 11,447,876 B2
(45) Date of Patent: Sep. 20, 2022

(54) HIGH-PRECISION ETCHING METHOD

(71) Applicant: Institute of Microelectronics, Chinese Academy of Sciences, Beijing (CN)

(72) Inventors: Huilong Zhu, Poughkeepsie, NY (US); Xiaogen Yin, Beijing (CN); Chen Li, Beijing (CN); Anyan Du, Beijing (CN); Yongkui Zhang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/962,084

(22) PCT Filed: Sep. 21, 2018

(86) PCT No.: PCT/CN2018/107034
§ 371 (c)(1),
(2) Date: Jul. 14, 2020

(87) PCT Pub. No.: WO2020/042254
PCT Pub. Date: Mar. 5, 2020

(65) Prior Publication Data
US 2021/0222303 A1     Jul. 22, 2021

(30) Foreign Application Priority Data
Aug. 28, 2018   (CN) .......................... 201810988644.4

(51) Int. Cl.
*C23F 1/16* (2006.01)
*H01L 21/306* (2006.01)

(52) U.S. Cl.
CPC .......... *C23F 1/16* (2013.01); *H01L 21/30604* (2013.01)

(58) Field of Classification Search
CPC ............................. C23F 1/16; H01L 21/30604
USPC ................................................... 438/745–754
See application file for complete search history.

(56) References Cited

U.S. PATENT DOCUMENTS

| 6,764,967 B2 | 7/2004 | Pai |
| 8,053,270 B2* | 11/2011 | Dimitrov ........ H01L 31/02363 438/71 |
| 2017/0365673 A1* | 12/2017 | Cheng ................ H01L 29/0649 |

FOREIGN PATENT DOCUMENTS

| CN | 1203441 A | 12/1998 |
| CN | 1964001 A | 5/2007 |
| CN | 103822813 A | 5/2014 |
| CN | 105374738 A | 3/2016 |
| CN | 106548944 A | 3/2017 |
| CN | 107068556 A | 8/2017 |

(Continued)

OTHER PUBLICATIONS

Translation of CN105374738A (Year: 2016).*

(Continued)

*Primary Examiner* — Duy Vu N Deo
(74) *Attorney, Agent, or Firm* — Davis Wright Tremaine LLP; Michael J. Donohue

(57) ABSTRACT

An embodiment of the present disclosure provides an etching method, having the following steps: forming a modified layer having a thickness of one or several atom layers on a selected region of a surface of a semiconductor material layer by using a modifier; and removing the modified layer. When a semiconductor is processed, this method achieves precise control over the etching thickness and improves the etching rate at the same time.

19 Claims, 8 Drawing Sheets

(56) References Cited

FOREIGN PATENT DOCUMENTS

CN    107424923 A    12/2017
CN    107845684 A    3/2018

OTHER PUBLICATIONS

Translation of CN1964001A (Year: 2007).*
Diameter of an Atom—the Physics Factbook (Year: 1996).*
International Search Report and Written Opinion dated Apr. 2, 2019, issued in International Patent Application No. PCT/CN2018/107034, filed Aug. 28, 2018, 9 pages.
Chinese Office Action dated Sep. 29, 2021, issued in Chinese Patent Application No. 201810989180.9, filed Aug. 28, 2018, 9 pages.
Chinese Office Action dated Apr. 20, 2022, issued in Chinese Patent Application No. 201810989180.9, filed Aug. 28, 2018, 13 pages.

* cited by examiner

HIGH-PRECISION ETCHING METHOD

REFERENCE TO RELATED APPLICATION

This application claims the priority of Chinese Patent Application 201810988644.4, entitled "High-Precision Etching Method," filed on Aug. 28, 2018, the contents of which are incorporated herein by reference.

TECHNICAL FIELD

The present disclosure generally relates to the technical field of semiconductors, and more specifically, in particular to a high-precision etching method.

BACKGROUND ART

As the requirements for various smart electronic devices are increasing, the requirements for small-size and highly functional semiconductor chips increase therewith. Therefore, the extended large-scale requirements for transistors are accompanied.

Although relatively small sizes of chips may have been achieved at present, problems with the processing precision are still encountered. For example, when a nanowire or a nanosheet is processed, the precise control over an etching process appears to be extremely important. Additionally, the selectivity is also very important for a process of forming a nanowire or a nanosheet by etching. The selectivity means that a target semiconductor material is removed by etching while the remaining semiconductor material is substantially intactly kept.

In the prior art, etching is achieved by providing different selectivity ratios. This etching process has an extremely high requirement for the selectivity ratio. However, it is more and more difficult to satisfy the requirements for smart electronic devices, due to the substantial difference between the selectivity ratios of different materials.

In summary, it is urgent to provide a method capable of improving the etching precision of semiconductor processing so as to at least partly solve the problems described above.

SUMMARY

In order to solve at least some of the problems described above, an embodiment of the present disclosure provides an etching method.

According to an embodiment of the present disclosure, the etching method comprises:

forming a modified layer having a thickness of one or several atom layers on a selected region of a surface of a semiconductor material layer by using a modifier; and removing the modified layer.

In some embodiments, it further comprises, after removing the modified layer: at least cleaning a surface, from which the modified layer is removed, by using a second cleaning agent.

In some embodiments, it further comprises: performing the steps of forming a modified layer by using a modifier and removing the modified layer repeatedly until a predetermined thickness of a semiconductor material layer is etched in the selected region.

In some embodiments, it further comprises, after forming a modified layer by using a modifier and before removing the modified layer: at least cleaning a surface, on which the modified layer is formed, by using a first cleaning agent.

In some embodiments, a process of forming the modified layer and a process of removing the modified layer are both isotropic.

In some embodiments, the modifier reacts with the selected region of the surface of the semiconductor material layer, and an increase rate of a thickness of the modified layer formed decreases as a time of a reaction with the modifier increases at least in a period of time.

In some embodiments, the reaction is self-limited.

In some embodiments, the modifier reacts with the selected region of the surface of the semiconductor material layer until a thickness of the modified layer having a thickness of one or several atom layers reaches a saturation thickness.

In some embodiments, a modified layer formed by a reaction between one or several atom layers in the selected region of the surface of the semiconductor material layer and the modifier prevents a further reaction between the selected region of the surface of the semiconductor material layer and the modifier.

In some embodiments, etching may be performed with an etching precision of 0.5 nm or less.

In some embodiments, the semiconductor material layer comprises Si or SiGe.

In some embodiments, a rate at which a modified layer formed on a SiGe surface is removed is greater than a rate at which a modified layer formed on a Si surface is removed.

In some embodiments, the modified layer comprises an oxide of Si or SiGe.

In some embodiments, the modifier includes a liquid or aqueous solution comprising one or a combination of several of ozone, potassium permanganate, potassium dichromate, nitric acid, sulfuric acid, and hydroperoxide, as well as an oxygen-containing gas or an oxygen-containing plasma.

In some embodiments, the etching agent comprises hydrofluoric acid, buffered hydrofluoric acid, BOE, hydrofluoric acid vapor, halogen hydride or vapor thereof, and the like.

In some embodiments, the first cleaning agent and second cleaning agent each comprise water, high-purity deionized water, ethanol, acetone, isopropanol, or a liquid of a combination of several thereof, or argon, helium, nitrogen, hydrogen, water vapor, or a gas of a combination of several thereof.

In some embodiments, the first cleaning agent and second cleaning agent each comprise a mixture of water, high-purity deionized water, ethanol, acetone, isopropanol, or a liquid of a combination of several thereof with a surfactant and/or a hydrophobic coating additive.

In some embodiments, the surfactant comprises an organic matter, which is an alcohol, an aldehyde, an ester, or an amine, or comprises a hydrophilic group on one end and a hydrophobic group on the other end.

In some embodiments, the hydrophobic coating additive comprises trimethylchlorosilane, $(CH3)_3SiN(CH3)_2$, propyldimethylchlorosilane, alkyltrialkoxysilane, hexadecyltrimethoxysilane, tetraethoxysilane, 3-glycidyloxypropyltrimethoxysilane, and a organosilicon coupling agent $R^aSi(R^b)_nX_{3-n}$, wherein $R^a$ is a $C_{1-24}$ linear or branched alkyl group or $R^a$ is an aromatic group separated from a silicon atom at a distance of 1 to 8 carbon atoms, $R^b$ is a $C_{1-6}$ short linear or branched alkyl group, X is a hydrolyzable group, and n=0, 1, 2.

In some embodiments, the hydrolyzable group comprises a halogen or an alkoxy group.

In some embodiments, the hydrophilic group on the one end comprises a —OH group or a —COOH group, and the hydrophobic group on the end comprises a hydrocarbyl group.

According to technical solutions of embodiments of the present disclosure, by cyclically performing operations of forming a modified layer and removing the modified layer, precise control (≤0.5 nm) over the etching thickness is achieved when a semiconductor is processes and the etching rate is improved at the same time.

DESCRIPTION OF DRAWINGS

The above and other features of the present disclosure will become more apparent through detailed descriptions hereinbelow in conjunction with accompanying drawings, in which.

In the accompanying drawings, the same or similar structures are represented by the same or similar reference numerals.

DESCRIPTION OF EMBODIMENTS

In order to enable objects, technical solutions, and advantages of the present application to be more obvious and clear, detailed descriptions are further made to the present application in conjunction with accompanying drawings below. It is to be noted that the following descriptions are only for the purpose of illustration, rather than limitation to this disclosure. In the description below, numerous specific details are set forth in order to provide a thorough understanding of this disclosure. However, it is apparent for those of ordinary skill in the art that it is not necessary to implement this disclosure by using these specific details. In other examples, well-known circuits, material, or methods are not specifically described in order to prevent this disclosure from being confused.

Throughout the description, references to "an embodiment", "embodiments", "an example", or "examples", or "some examples" mean that specific features, structures, or characteristics described in conjunction with the embodiment(s) or example(s) are included in at least one embodiment of this disclosure. Therefore, phrases "in an embodiment", "in embodiments", "an example", or "examples" present in various positions throughout the description are not necessarily refer to the same embodiment or example. Additionally, specific features, structures, or characteristics may be combined one or more embodiments or examples in any appropriate combination and/or sub-combination. Additionally, it is to be understood by those of ordinary skill in the art that the accompanying drawings provided herein are all for the purpose of illustration, and the accompanying drawings are not necessarily drawn to scale. The term "and/or" used herein includes any and all combinations of one or more of the associated listed items.

Figure 1:
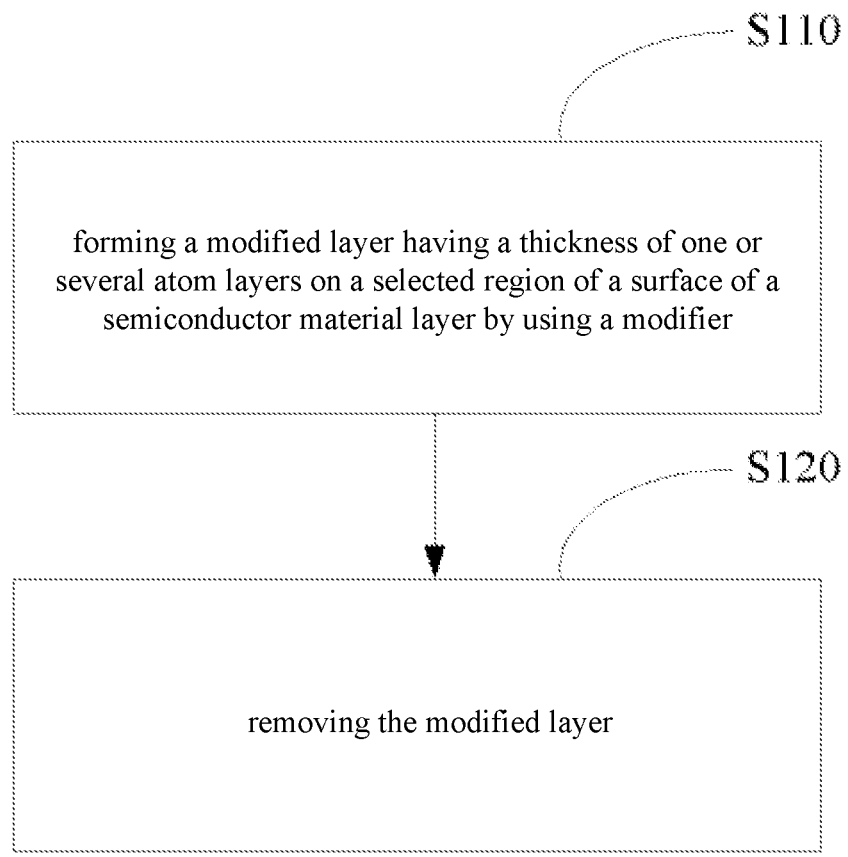
FIG. 1 shows a flow chart of an etching method according to an embodiment of this disclosure.

FIG. 1 shows a flow chart of an etching method according to an embodiment of this disclosure. As shown in FIG. 1, the etching method comprises the steps of:

In step S110, forming a modified layer having a thickness of one or several atom layers on a selected region of a surface of a semiconductor material layer by using a modifier.

Particularly, the semiconductor material layer to be etched may comprise various material layers formed on a substrate. The selected region on the surface of the semiconductor material layer may comprise a specific region which is to be processed to form a plurality of features. In a particular embodiment, the selected region may be processed (for example, etched) to form a planar region having a certain thickness. In another particular embodiment, the selected region may be processed (for example, etched) to form a region having a groove structure or a via hole structure. However, embodiments of the present disclosure are not limited thereto.

In an embodiment of the present disclosure, the modifier reacts with the surface of the semiconductor material layer to be etched to perform modification treatment on the semiconductor, so as to form a modified layer having a thickness of only one or several atom layers on the surface of the semiconductor material layer.

In a particular embodiment, the specific process of forming the modified layer on the selected region of the surface of the semiconductor material layer by using the modifier may comprise allowing the selected region of the surface of the semiconductor material layer to react with the modifier so as to form the modified layer on the selected region of the surface of the semiconductor material layer.

In a particular embodiment, in the process in which the modifier reacts with the selected region of the surface of the semiconductor material layer, the increase rate of the thickness of the modified layer formed decreases as the time of the reaction with the modifier increases at least in a period of time.

In a particular embodiment, the reaction between the modifier and the selected region of the surface of the semiconductor material layer self-limited and the reaction does not stop until the thickness of the modified layer formed having a thickness of one or several atom layers reaches a saturation thickness.

In a particular embodiment, in the process in which the modifier reacts with the selected region of the surface of the semiconductor material layer, the modified layer formed covers the surface of the semiconductor material layer and can prevent a further reaction between the selected region of the surface of the semiconductor material layer and the modifier.

Additionally, in a specific embodiment, the process of forming the modified layer is isotropic. That is, the reaction between the surface of the semiconductor material layer and the modifier uniformly occurs in every direction in which the surface of the semiconductor material layer is in contact with the modifier.

Furthermore, in a specific embodiment, the modifier used may be a liquid or aqueous solution comprising one or a combination of several of ozone ($O_3$), potassium permanganate ($KMnO_4$), potassium dichromate ($K_2Cr_2O_7$), nitric acid ($HNO_3$), sulfuric acid ($H_2SO_4$), and hydroperoxide ($H_2O_2$), or may be an oxygen-containing gas, an oxygen-containing plasma, or the like.

Next, in step S120, the modified layer is removed.

Particularly, the modified layer formed may be removed by a method of etching.

In a particular embodiment, the specific process of removing the modified layer comprises allowing the modified layer formed on the surface of the semiconductor material layer to be brought into complete contact with an etching agent and performing a reaction between the modified layer and the etching agent to remove the modified layer, wherein the reaction between the modified layer and the etching agent is finished when the modified layer is completely removed.

As can be seen from the process described above, the process of removing the modified layer is also somewhat self-limited. That is, when the reaction between the etching agent and the modified layer formed on the surface of the semiconductor material layer is complete, the process of etching automatically stops. That is, etching agent will not react with a surface of the semiconductor material layer which is not subjected to a modification reaction.

Additionally, in a specific embodiment, the process of removing the modified layer, i.e., the process of etching described above, is isotropic. That is, the reaction between the modified layer formed on the surface of the semiconductor material layer and the etching agent uniformly occurs in every direction.

Furthermore, in a specific embodiment, the etching agent used comprises hydrofluoric acid (HF), buffered hydrofluoric acid (BHF), BOE, hydrofluoric acid vapor, halogen hydride or vapor thereof, and the like. wherein BOE is also a buffered etching liquid, which may be formed by mixing HF and $NH_4F$ at various proportions.

In the prior art, a one-step oxidation method is typically used. Since it has a high oxidation rate, the thickness of the modified layer formed will not be conveniently controlled. If oxidation is additionally controlled by a special means to be performed slowly, the etching rate will be overall influenced, leading to an excessively low etching rate. In the present application, the reaction rate is high in the initial phase of the reaction occurring between the surface of the semiconductor material layer and the modifier. Since the increase rate of the thickness of the modified layer formed decreases as the time of the reaction with the modifier increases, the reaction rate will rapidly decrease as the reaction is performed. Therefore, the etching method in an embodiment of the present disclosure can significantly improve the etching rate under the condition where the etching amount or the thickness is well controlled.

One reason is that the thickness of the modified layer formed is a thickness of only one or several atom layers. Another reason is that the reaction between the surface of the semiconductor material layer and the modifier automatically stops after the thickness of the modified layer formed on the surface of the semiconductor material layer reaches a saturation thickness. Therefore, the etching method of in an embodiment of the present disclosure can well control the etching thickness and contributes to more precise control over the etching precision at the same time.

According to a method in an embodiment of the present disclosure, the surface of the semiconductor material layer can be etched with an etching precision of 0.5 nm or less or an etching precision superior to 0.5 nm.

Figure 2:
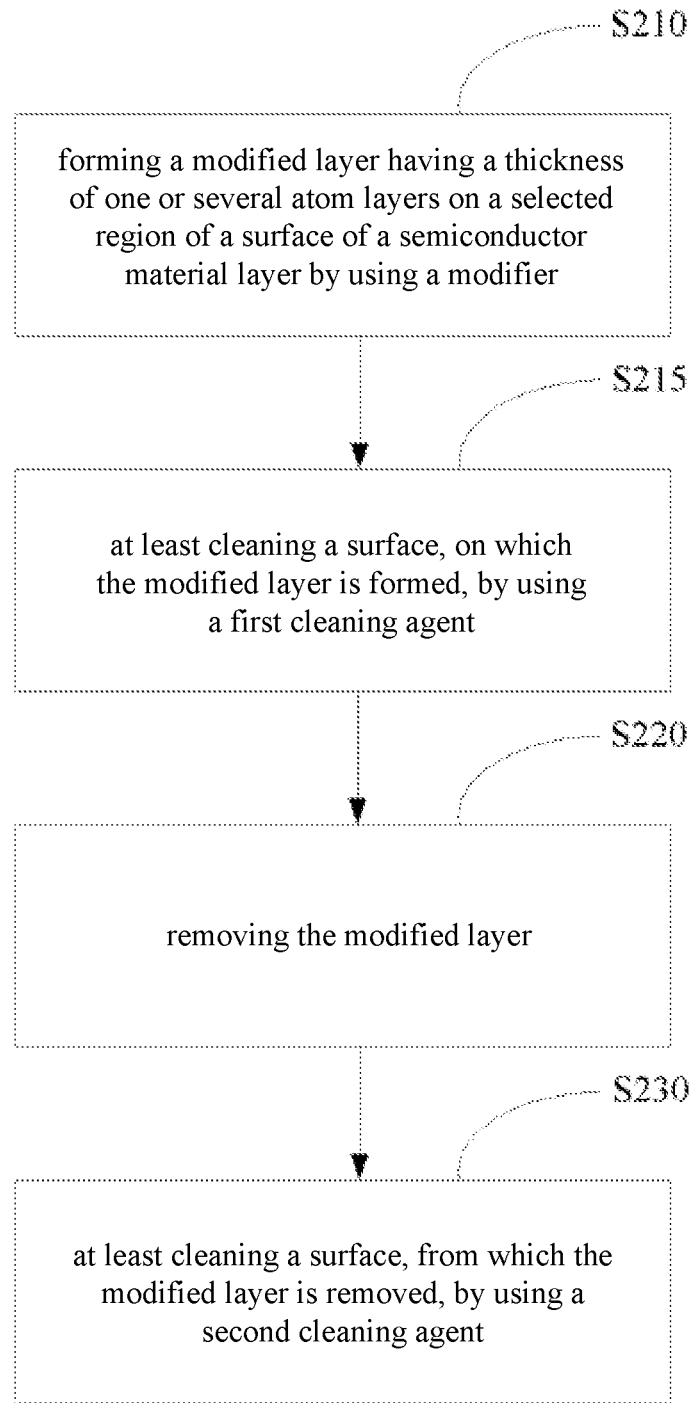
FIG. 2 shows a flow chart of an etching method according to another embodiment of this disclosure.

FIG. 2 shows a flow chart of an etching method according to another embodiment of this disclosure. The main differences between this embodiment and the etching method as shown in FIG. 1 are as follows.

On the one hand, step S215 is performed after forming a modified layer and before removing the modified layer formed (between step S210 and step S220).

Step S215 comprises at least cleaning a surface, on which the modified layer is formed, by using a first cleaning agent.

After the operation of forming the modified layer is finished, a modifier residue and/or various residues of resultants in the reaction will be present on the modified layer and/or the surface of the semiconductor material layer. Therefore, after the operation of forming the modified layer is finished, it is required to clean the modified layer formed by using a cleaning agent or a surface of the semiconductor material layer except the modified layer may be cleaned at the same time, so as to remove these contaminants, reduce cross contamination between various preceding and succeeding steps, and ensure the processing quality of the surface of the semiconductor material layer, and the like.

On the other hand, step S230 is performed after removing the modified layer (after step S220).

Step S230 comprises at least cleaning a surface, from which the modified layer is removed, by using a second cleaning agent.

Likewise, after the operations of forming the modified layer and removing the modified layer are sequentially finished, a modifier residue, an etching agent residue, and/or various residues of resultants in the reaction will be present on the surface of the semiconductor material layer. Therefore, after the operations of forming the modified layer and removing the modified layer are sequentially finished, it is required to clean the surface of the semiconductor material layer by using a cleaning agent, so as to remove these contaminants and ensure the processing quality of the surface of the semiconductor material layer.

In a particular embodiment, the first cleaning agent and second cleaning agent used may each comprise water, high-purity deionized water, ethanol, acetone, isopropanol, or a liquid of a combination of several thereof, or argon, helium, nitrogen, hydrogen, water vapor, or a gas of a combination of several thereof, or the like.

In a particular embodiment, the first cleaning agent and second cleaning agent used may also each comprise a mixture of water, high-purity deionized water, ethanol, acetone, isopropanol, a liquid of a combination of several thereof, or the like with a surfactant and/or a hydrophobic coating additive.

The surfactant may reduce the surface tension of the cleaning agent (water, high-purity deionized water, ethanol, acetone, isopropanol, or the like), and the hydrophobic coating additive may reduce the affinity between the cleaning agent (water, high-purity deionized water, ethanol, acetone, isopropanol, or the like) and the surface to be cleaned or may obtain a surface hydrophobicity. The surfactant and/or hydrophobic coating additive may be added to the cleaning agent (water, high-purity deionized water, ethanol, acetone, isopropanol, or the like). In a particular embodiment, the surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may comprise trimethylchlorosilane (TMCS), TMSDMA (($CH3$)$_3$SiN($CH3$)$_2$), propyldimethylchlorosilane, alkyltrialkoxysilane, hexadecyltrimethoxysilane, tetraethoxysilane, 3-glycidyloxypropyltrimethoxysilane, and a organosilicon coupling agent $R^a Si(R^b)_n X_{3-n}$, wherein $R^a$ is a $C_{1-24}$ linear or branched alkyl group or $R^a$ is an aromatic group separated from a silicon atom at a distance of 1 to 8 carbon atoms, $R^b$ is a $C_{1-6}$ short linear or branched alkyl group, X is a hydrolyzable group, and n=0, 1, 2. The hydrolyzable group comprises a halogen or an alkoxy group. When a solid surface is treated, one end of the coupling agent reacts with a surface active group and the other end forms a directionally arranged monomolecular layer toward air, and there is a significant water-repelling effect. The hydrophobic coating additive may perform surface treatment or silanization treatment on the surface to be cleaned, and the hydrophobic coating additive comprises a silane agent.

Step S210 and step S220 may be performed with reference to step S110 and step S120 as shown in FIG. 1, and verbose words are omitted herein.

Figure 3:
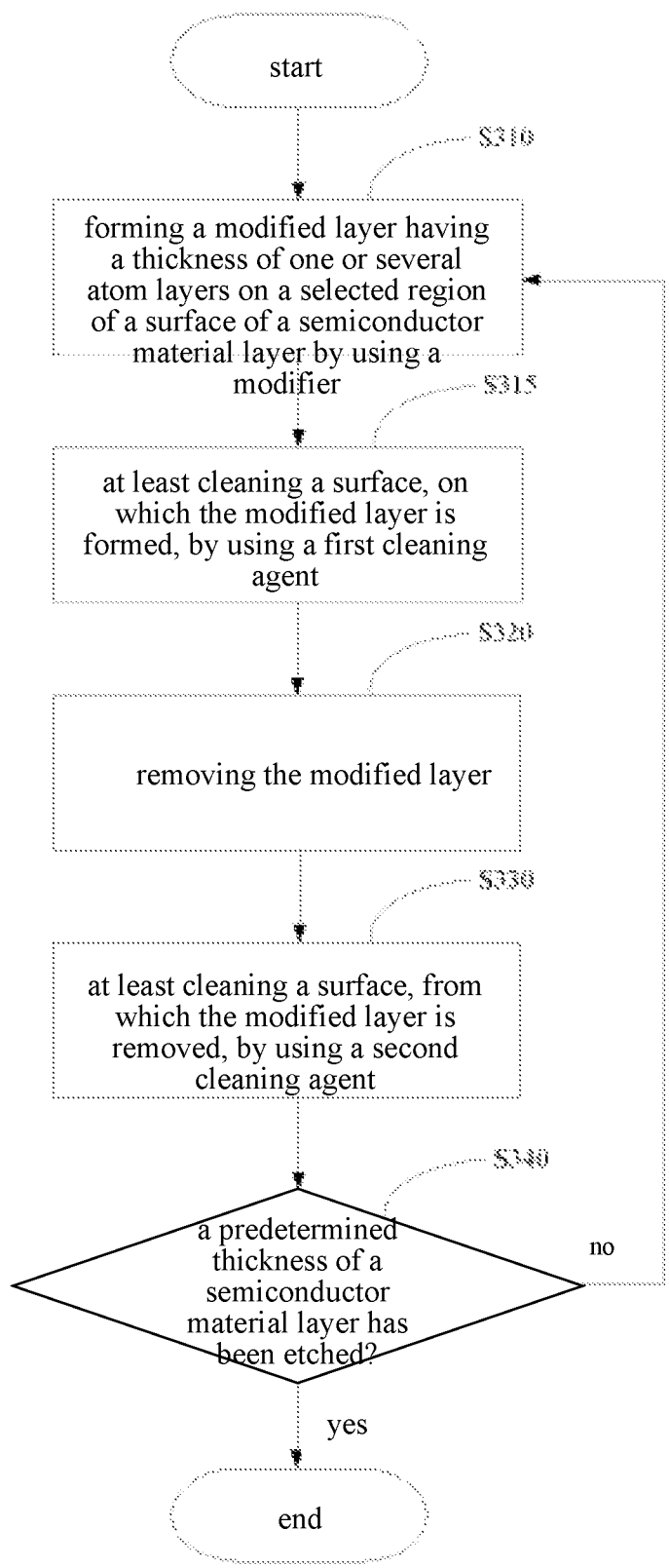
FIG. 3 shows a flow chart of an etching method according to still another embodiment of this disclosure.

FIG. 3 shows a flow chart of an etching method according to still another embodiment of this disclosure.

Step S310, step S315, step S320, and step S330 as shown in FIG. 3 may correspond to step S210, step S215, step S220, and step S230 of the embodiment in FIG. 2, respectively. Therefore, the process of performing these steps may be obtained with reference to the embodiment as shown in FIG. 2, and only differences therein are described herein.

In this embodiment, after step S310, step S315, step S320, and step S330 are performed sequentially, it further comprises:

Step S340 of determining whether a predetermined thickness of a semiconductor material layer has been etched in the selected region. That is, whether a predetermined etching amount or etching thickness is reached after one or more processes of forming a modified layer and removing the modified layer.

If it is determined that a predetermined thickness of a semiconductor material layer has been etched in the selected region, the process can be finished.

If it is determined that a predetermined thickness of a semiconductor material layer has not been etched in the selected region, return to step S310 and perform a cyclic etching process until it is finally determined that a predetermined thickness of a semiconductor material layer has been etched in the selected region.

In another embodiment of the present disclosure, after a cyclic etching process is finished, the etching amount may be preliminarily estimated, and the thickness is examined only when it is preliminarily estimated that a predetermined thickness is reached rather than examined after each cyclic etching.

Additionally, in this embodiment, after forming a modified layer by using a modifier and before removing the modified layer formed, i.e., between step S310 and step S320, it is required to perform:

Step S315: at least cleaning a surface, on which the modified layer is formed, by using a first cleaning agent.

This is because the modifier and/or the etching agent are typically repeatedly used in the process of cyclic etching for the purpose of saving the modifier and/or the etching agent. Therefore, after forming a modified layer, the surface of the modified layer formed is cleaned by using a first cleaning agent (i.e., step S315 is performed), or the surface of the semiconductor material layer except the modified layer may be cleaned at the same time, so that the modifier can be prevented from being carried by the semiconductor material into the etching agent for removing the modified layer.

Likewise, in the process of cyclic etching, after removing the modified layer, the surface of the semiconductor material layer exposed again is cleaned by using a second cleaning agent (i.e., step S330 is performed), so that the etching agent for removing the modified layer carried by the semiconductor material into the repeatedly used modifier may be reduced.

By adding step S315 and step S330, it possible to effectively prevent cross contamination in the process of semiconductor etching, prevent the process fluctuation, and improve the processing quality.

In a particular embodiment, the first cleaning agent and second cleaning agent used may each comprise water, high-purity deionized water, ethanol, acetone, or isopropanol.

In a particular embodiment, the first cleaning agent and second cleaning agent used may also each comprise a mixture of water, high-purity deionized water, ethanol, acetone, isopropanol, a liquid of a combination of several thereof, or the like with a surfactant and/or a hydrophobic coating additive.

The surfactant may reduce the surface tension of the cleaning agent (water, high-purity deionized water, ethanol, acetone, isopropanol, a liquid of a combination of several thereof, or the like), and the hydrophobic coating additive may reduce the affinity between the cleaning agent (water, high-purity deionized water, ethanol, acetone, isopropanol, a liquid of a combination of several thereof, or the like) and the surface to be cleaned or may obtain a surface hydrophobicity. The surfactant and/or hydrophobic coating additive may be added to the cleaning agent (water, high-purity deionized water, ethanol, acetone, isopropanol, a liquid of a combination of several thereof, or the like). In a particular embodiment, the surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may comprise trimethylchlorosilane (TMCS), TMSDMA ((CH3)$_3$SiN(CH3)$_2$), dimethyldichlorosilane, propyldimethylchlorosilane, alkyltrialkoxysilane, hexadecyltrimethoxysilane, tetraethoxysilane, 3-glycidyloxypropyltrimethoxysilane, and a organosilicon coupling agent $R^aSi(R^b)_nX_{3-n}$, wherein $R^a$ is a $C_{1-24}$ linear or branched alkyl group or an aromatic group separated from a silicon atom at a distance of 1 to 8 carbon atoms, $R^b$ is a $C_{1-6}$ short linear or branched alkyl group, X is a hydrolyzable group, and n=0, 1, 2. the hydrolyzable group comprises a halogen or an alkoxy group. When a solid surface is treated, one end of the coupling agent reacts with a surface active group and the other end forms a directionally arranged monomolecular layer toward air, and there is a significant water-repelling effect. The hydrophobic coating additive may perform surface treatment or silanization treatment on the surface to be cleaned, and the hydrophobic coating additive comprises a silane agent.

According to technical solutions of embodiments of the present disclosure, the precise control over the etching thickness when a semiconductor is processes is achieved by cyclically performing operations of forming a modified layer and removing the modified layer.

The etching method of the present disclosure and the etching effect thereof will be described in more detail below in conjunction with specific examples according to embodiments of the present disclosure as shown in FIGS. 4A to 4E and FIGS. 5A to 5E.

With reference to FIGS. 4A to 4E, an example of a process of an etching method according to an embodiment of this disclosure is shown. More particularly, FIGS. 4A to 4E show an example in which a surface of a semiconductor material layer to be etched is an exposed Si surface or SiGe surface.

Figure 4A:
FIGS. 4A to 4E show an example of a process of an etching method according to an embodiment of this disclosure.

As shown in FIG. 4A, a substrate having an exposed patterned Si surface (or SiGe surface) 41 is first provided. Additionally, the upper side of the Si surface (or SiGe surface) 41 is further covered with a nitride layer 42.

Figure 4B:
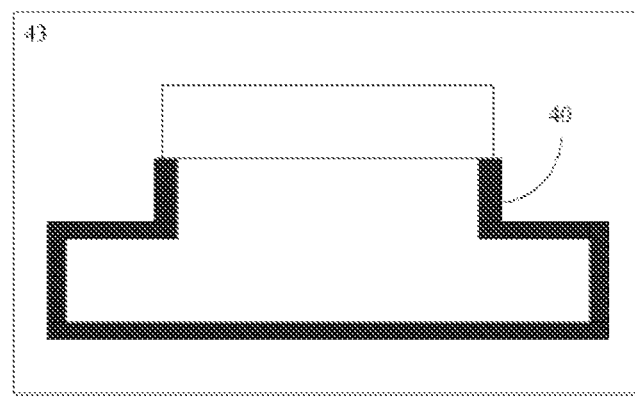

Next, as shown in FIG. 4B, the substrate described above is placed in its entirety into a surface modifier 43. The modifier 43 used may be a liquid or aqueous solution comprising one or a combination of several of ozone ($O_3$), potassium permanganate ($KMnO_4$), potassium dichromate ($K_2Cr_2O_7$), nitric acid ($HNO_3$), sulfuric acid ($H_2SO_4$), and hydroperoxide ($H_2O_2$), or may be an oxygen-containing gas, an oxygen-containing plasma, or the like.

Since the surface of Si (or SiGe) except the uppermost surface covered by the nitride layer 42 is completely in contact with the modifier 43, the surface described above reacts with the modifier 43 to consume a certain amount of Si (or SiGe) and form a thin modified layer 40 on the surface. For example, the modified layer may be specifically an oxide of Si (or SiGe) having a thickness of one or several atom layers.

Since the uppermost surface of Si (or SiGe) is covered by the nitride layer 42, it is prevented from being brought into contact with the modifier 43. Therefore, the modified layer 40 will not be formed on the uppermost surface of Si (or SiGe).

When the thickness of the modified layer formed on the exposed surface of Si (or SiGe) reaches a saturation thickness, the reaction between the exposed surface of Si (or SiGe) and the modifier 43 is finished.

Next, it is desired to clean the reacted surface by using a first cleaning agent.

Figure 4C:
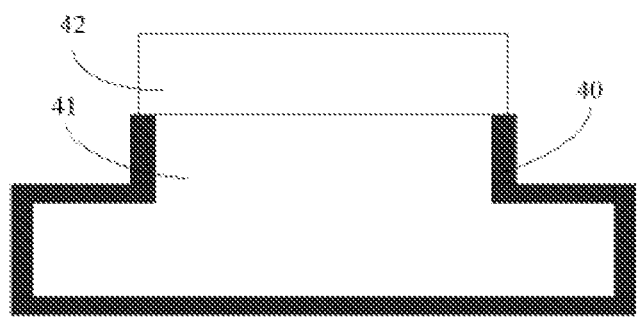

Preferably, the surface of the modified layer formed may be cleaned by using a cleaning agent such as water, high-purity deionized water, acetone, or a liquid of a combination of several thereof, or argon, helium, nitrogen, hydrogen, water vapor, or a gas of a combination of several thereof, or the like. In this way, the residue of the modifier may be prevented, as shown in FIG. 4C. Preferably, in order to reduce the surface tension of the cleaning agent (water, high-purity deionized water, ethanol, acetone, isopropanol, a liquid of a combination of several thereof, or the like) and/or the affinity between the cleaning agent and the surface to be cleaned, the surfactant and/or hydrophobic coating additive may also be added to the cleaning agent (water, high-purity deionized water, ethanol, acetone, isopropanol, or a liquid of a combination of several thereof) to clean the surface of the modified layer formed. The surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may reduce the affinity between the cleaning agent (water, high-purity deionized water, ethanol, acetone, isopropanol, or a liquid of a combination of several thereof) and the surface to be cleaned or may obtain a surface hydrophobicity. The surfactant and/or hydrophobic coating additive may be added to the cleaning agent (water, high-purity deionized water, ethanol, acetone, isopropanol, or a liquid of a combination of several thereof). In a particular embodiment, the surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may comprise trimethylchlorosilane (TMCS), TMSDMA (($CH3)_3SiN(CH3)_2$), dimethyldichlorosilane, propyldimethylchlorosilane, alkyltrialkoxysilane, hexadecyltrimethoxysilane, tetraethoxysilane, 3-glycidyloxypropyltrimethoxysilane, and a organosilicon coupling agent $R^aSi(R^b)_nX_{3-n}$, wherein $R^a$ is a $C_{1-24}$ linear or branched alkyl group or $R^a$ is an aromatic group separated from a silicon atom at a distance of 1 to 8 carbon atoms, $R^b$ is a $C_{1-6}$ short linear or branched alkyl group, X is a hydrolyzable group, and n=0, 1, 2. The hydrolyzable group comprises a halogen or an alkoxy group. When a solid surface is treated, one end of the coupling agent reacts with a surface active group and the other end forms a directionally arranged monomolecular layer toward air, and there is a significant water-repelling effect. The hydrophobic coating additive may perform surface treatment or silanization treatment on the surface to be cleaned, and the hydrophobic coating additive comprises a silane agent.

Figure 4D:
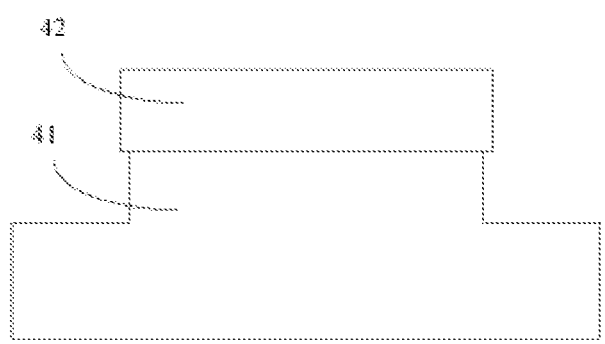

Then, Si (or SiGe), which is cleaned and formed with the modified layer 40, is etched by using an etching agent to remove the modified layer 40. The etching agent used may be hydrofluoric acid (HF), buffered hydrofluoric acid (BHF), BOE, hydrofluoric acid vapor, halogen hydride or vapor thereof, and the like. After etching is finished, the surface of Si (or SiGe), which is originally exposed, is etched off and reduced or is partly etched, while the uppermost surface of Si (or SiGe) covered with the nitride layer 42 is not etched, as shown in FIG. 4D.

Preferably, after the process of etching is finished, the surface of the semiconductor material layer is cleaned by using a second cleaning agent to remove an etching agent residue and/or various residues of resultants in the reaction so as to prevent cross contamination. Preferably, the surface of the semiconductor may be cleaned by using water, high-purity deionized water, ethanol, acetone, isopropanol, or a liquid of a combination of several thereof, or argon, helium, nitrogen, hydrogen, water vapor, or a gas of a combination of several thereof, or the like. Preferably, in order to reduce the surface tension of the cleaning agent (water, high-purity deionized water, ethanol, acetone, isopropanol, or a liquid of a combination of several thereof), and since the hydrophobic coating additive may reduce the affinity between the cleaning agent (water, high-purity deionized water, ethanol, acetone, isopropanol, or a liquid of a combination of several thereof) and the surface to be cleaned or may obtain a surface hydrophobicity, the surfactant may also be added to the cleaning agent to clean the surface of the semiconductor. The surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may reduce the affinity between the cleaning agent (water, high-purity deionized water, ethanol, acetone, isopropanol, a liquid of a combination of several thereof, or the like) and the surface to be cleaned or may obtain a surface hydrophobicity. The surfactant and/or hydrophobic coating additive may be added to the cleaning agent (water, high-purity deionized water, ethanol, acetone, isopropanol, a liquid of a combination of several thereof, or the like). In a particular embodiment, the surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may comprise trimethylchlorosilane (TMCS), TMSDMA (($CH3$)$_3$SiN($CH3$)$_2$), dimethyldichlorosilane, propyldimethylchlorosilane, alkyltrialkoxysilane, hexadecyltrimethoxysilane, tetraethoxysilane, 3-glycidyloxypropyltrimethoxysilane, and a organosilicon coupling agent $R^aSi(R^b)_nX_{3-n}$, wherein $R^a$ is a $C_{1-24}$ linear or branched alkyl group or $R^a$ is an aromatic group separated from a silicon atom at a distance of 1 to 8 carbon atoms, $R^b$ is a $C_{1-6}$ short linear or branched alkyl group, X is a hydrolyzable group, and n=0, 1, 2. The hydrolyzable group comprises a halogen or an alkoxy group. When a solid surface is treated, one end of the coupling agent reacts with a surface active group and the other end forms a directionally arranged monomolecular layer toward air, and there is a significant water-repelling effect. The hydrophobic coating additive may perform surface treatment or silanization treatment on the surface to be cleaned, and the hydrophobic coating additive comprises a silane agent.

Figure 4E:
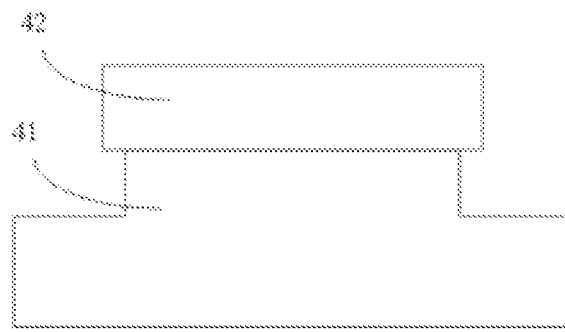

Finally, whether the exposed surface of Si (or SiGe) has been already etched to a predetermined thickness is determined. If not, operations of forming a modified layer and removing the modified layer are repeatedly performed with reference to FIGS. 4B to 4D, until a predetermined etching thickness is reached as shown in FIG. 4E.

As can be seen, in this example, selective etching of a part of the surface of Si (or SiGe), i.e., the exposed surface of Si (or SiGe), is achieved by forming the modified layer several times and etching the modified layer several times.

With reference to FIGS. 5A to 5E, another example of a process of an etching method according to an embodiment of this disclosure is shown. More particularly, FIGS. 5A to 5E show an example in which a surface of a semiconductor material layer to be processed is a partial surface (exposed surface) having a SiGe layer.

Figure 5A:
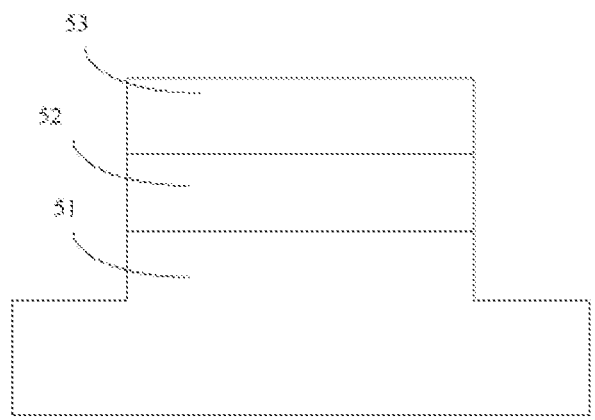
FIGS. 5A to 5E show another example of a process of an etching method according to an embodiment of this disclosure.

As shown in FIG. 5A, First, exposed patterned Si layer 51, SiGe layer 52, and Si layer 53 are formed on a Si substrate. The SiGe layer 52 and the Si layer 53 may be generated by deposition and subsequent patterning by using a method such as epitaxial growth, CVD, or the like. As can be seen from the figure, the semiconductor structure has both a Si surface and a SiGe surface, which are exposed.

Figure 5B:
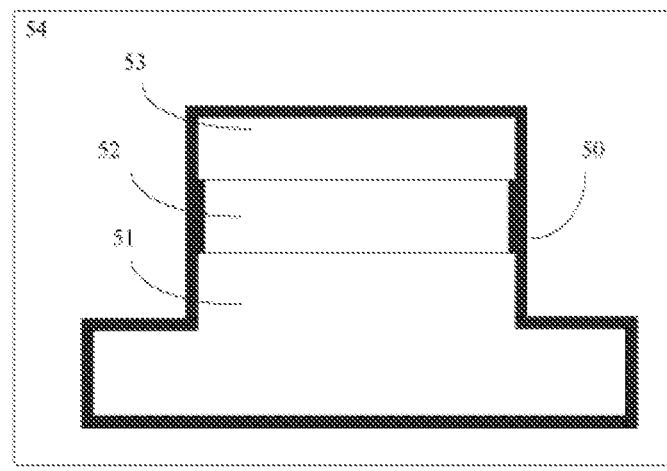

Next, the substrate described above is placed in its entirety into a surface modifier 54. The modifier 54 used may be a liquid or aqueous solution comprising one or a combination of several of ozone ($O_3$), potassium permanganate ($KMnO_4$), potassium dichromate ($K_2Cr_2O_7$), nitric acid ($HNO_3$), sulfuric acid ($H_2SO_4$), and hydroperoxide ($H_2O_2$), or may be an oxygen-containing gas, an oxygen-containing plasma, or the like, as shown in FIG. 5B.

A modified layer 50 will be formed on both the Si surface and the SiGe surface, which are exposed, due to the effect of the modifier. The modified layer 50 may be specifically an oxide of Si or an oxide of SiGe (for example, SiGeO) having a thickness of one or several atom layers.

Next, it may be optional to clean the reacted surface by using a first cleaning agent.

Figure 5C:
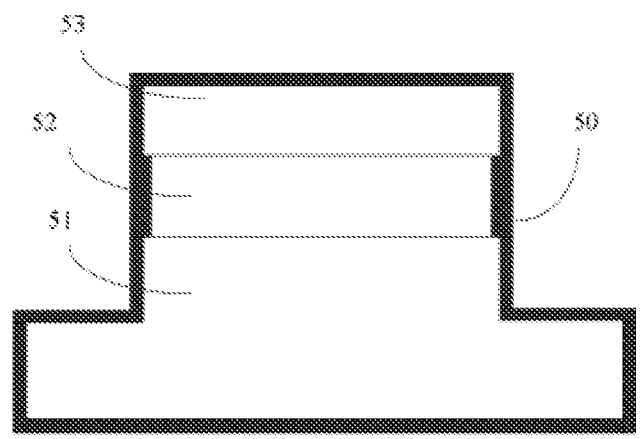

Preferably, the surface of the modified layer formed may be cleaned by using a cleaning agent such as water, high-purity deionized water, ethanol, acetone, isopropanol, or a liquid of a combination of several thereof, or argon, helium, nitrogen, hydrogen, water vapor, or a gas of a combination of several thereof, or the like. In this way, the residue of the modifier may be prevented, as shown in FIG. 5C. Preferably, a first cleaning agent (water, high-purity deionized water, ethanol, acetone, isopropanol, a liquid of a combination of several thereof, or the like) comprising a surfactant and/or a hydrophobic coating additive may also be used to at least clean the surface of the modified layer formed. The surfactant used may reduce the surface tension of the first cleaning agent (water, high-purity deionized water, ethanol, acetone, isopropanol, or a liquid of a combination of several thereof) and/or the affinity between the first cleaning agent and the surface of the modified layer. The surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may reduce the affinity between the cleaning agent (water, high-purity deionized water, ethanol, acetone, isopropanol, a liquid of a combination of several thereof, or the like) and the surface to be cleaned or may obtain a surface hydrophobicity. The surfactant and/or hydrophobic coating additive may be added to the cleaning agent (water, high-purity deionized water, ethanol, acetone, isopropanol, a liquid of a combination of several thereof, or the like). In a particular embodiment, the surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may comprise trimethylchlorosilane (TMCS), TMSDMA (($CH3$)$_3$SiN($CH3$)$_2$), dimethyldichlorosilane, propyldimethylchlorosilane, alkyltrialkoxysilane, hexadecyltrimethoxysilane, tetraethoxysilane, 3-glycidyloxypropyltrimethoxysilane, and a organosilicon coupling agent $R^aSi(R^b)_nX_{3-n}$, wherein $R^a$ is a $C_{1-24}$ linear or branched alkyl group or $R^a$ is an aromatic group separated from a silicon atom at a distance of 1 to 8 carbon atoms, $R^b$ is a $C_{1-6}$ short linear or branched alkyl group, X is a hydrolyzable group, and n=0, 1, 2. The hydrolyzable group comprises a halogen or an alkoxy group. When a solid surface is treated, one end of the coupling agent reacts with a surface active group and the other end forms a directionally arranged monomolecular layer toward air, and there is a significant water-repelling effect. The hydrophobic coating additive may perform surface treatment or silanization treatment on the surface to be cleaned, and the hydrophobic coating additive comprises a silane agent.

Then, the modified layer 50 is etched by using an etching agent to remove the modified layer 50. The etching agent used may be hydrofluoric acid (HF), buffered hydrofluoric acid (BHF), BOE, hydrofluoric acid vapor, halogen hydride or vapor thereof, and the like.

Figure 5D:
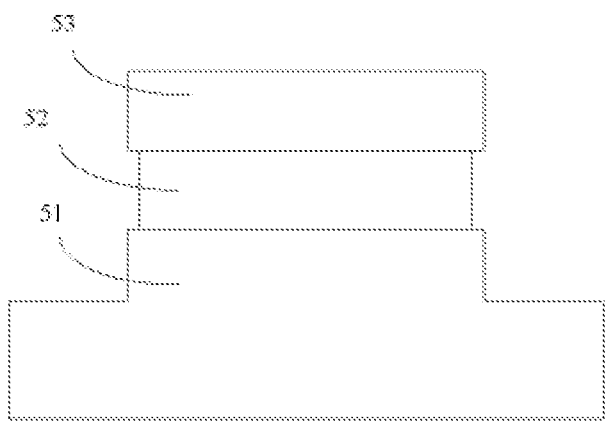
Figure 5E:
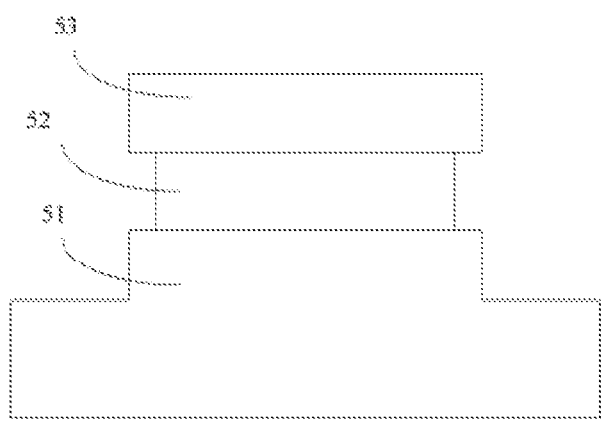

It is to be noted that selective etching of SiGe can be achieved in this example, as shown in FIGS. 5D and 5E. Little or only a small amount of the Si surface, which is originally exposed, is etched off, so as to expose its surface. A certain thickness of the exposed surface of SiGe is remarkably reduced due to a high etching rate.

In the phase of forming the modified layer, a specific modifier and an appropriate process control (for example, a reaction temperature of 5 C to 90 C and/or a reaction time of 1 second to 200 seconds) are used, so that the forming rate of the modified layer on the SiGe surface may be greater than the forming rate of the modified layer on the Si surface.

Therefore, the thickness of the modified layer formed on the SiGe surface will be greater than the thickness of the modified layer formed on the Si surface within the same reaction time. In other words, the number of atoms of Si and Ge consumed in forming the modified layer on the SiGe surface is greater than the number of atoms of Si consumed on the Si surface. Thus, after the modified layer formed is etched, the SiGe layer 52 will be etched more while the Si layer 51 and the Si layer 53 will be etched less, as shown in FIGS. 5D and 5E. Therefore, selective etching of SiGe is achieved.

More particularly, the increase rate of the thickness of the modified layer increases as the temperature of the modifier increases, and increases as the concentrations of ozone ($O_3$), potassium permanganate ($KMnO_4$), potassium dichromate ($K_2Cr_2O_7$), nitric acid ($HNO_3$), sulfuric acid ($H_2SO_4$), and hydroperoxide ($H_2O_2$) contained in the modifier increase. It is also possible to increase the reaction rate or increase the growth rate of the modified layer by stirring the modifier.

In another aspect, in the phase of forming the modified layer, although there may be a problem of different rates at which the modified layer of the SiGe surface and the modified layer of the Si surface are formed, selective etching of SiGe may be optionally achieved in the process of removing the modified layer if the difference in the thicknesses of the modified layers formed is not very large.

Particularly, in the phase of etching the modified layer, a specific etching agent and an appropriate process control (for example, an etching temperature of 5 C to 80 C and/or an etching time of 2 seconds to 120 seconds) are used, so that the etching rate of the modified layer formed on the SiGe surface is greater than the etching rate of the modified layer formed on the Si surface. Therefore, when the etching of the modified layer formed on the SiGe surface is finished to expose the SiGe surface again, the modified layer formed on the Si surface may have not been already etched. In another example, only a small part or none of the modified layer formed on the Si surface may be etched off. Thus, the modified layer formed on the Si surface may be used as a protective layer structure, which protects the Si surface in subsequent cyclic etching processes. SiGe is then gradually etched by subsequent cyclic etching processes and selective etching of SiGe is finally achieved.

Unlike the selective etching achieved mainly on the basis of the phase of removing the modified layer, the selective etching achieved on the basis of the phase of forming the modified layer requires a material to be selectively etched (for example, SiGe), wherein the thickness of the modified layer formed therefrom or the consumption amount of the material to be selectively etched must be greater than the thickness of the modified layer formed from the material which is not selectively etched (for example, Si) or the consumption amount thereof, as shown in FIGS. 5B and 5C. The selective etching achieved on the basis of the phase of removing the modified layer does not require the difference between the thicknesses of the modified layers formed from the two materials.

Additionally, different etching rates of SiGe and Si may be achieved by adjusting the content of Ge in SiGe. Therefore, the content of Ge in SiGe is preferably greater than 10% (Ge %>10%) in order to obtain a good etching selectivity, when SiGe is etched at a rate higher than the rate at which Si is etched.

In this example, it is also determined whether the exposed surface of SiGe has been already etched to a predetermined thickness. If the predetermined thickness is not reached, the predetermined etching thickness is achieved by cyclic etching. Next, it may be optional to clean the reacted surface by using a second cleaning agent. Preferably, the surface of the modified layer formed may be cleaned by using a cleaning agent such as water, high-purity deionized water, ethanol, acetone, isopropanol, or a liquid of a combination of several thereof, or argon, helium, nitrogen, hydrogen, water vapor, or a gas of a combination of several thereof, or the like. Preferably, a second cleaning agent (water, high-purity deionized water, ethanol, acetone, isopropanol, or a liquid of a combination of several thereof) comprising a surfactant and/or a hydrophobic coating additive may also be used to at least clean the surface of the modified layer formed. The surfactant used may reduce the surface tension of the second cleaning agent (water, high-purity deionized water, ethanol, acetone, isopropanol, or a liquid of a combination of several thereof) and/or the affinity between the cleaning agent and the surface of Si or SiGe. The surfactant comprises an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may reduce the affinity between the cleaning agent (water, high-purity deionized water, ethanol, acetone, isopropanol, a liquid of a combination of several thereof, or the like) and the surface to be cleaned or may obtain a surface hydrophobicity. The surfactant and/or hydrophobic coating additive may be added to the cleaning agent (water, high-purity deionized water, ethanol, acetone, isopropanol, a liquid of a combination of several thereof, or the like). In a particular embodiment, the surfactant used may comprise an organic matter, which is an alcohol, an aldehyde, an ester, or an amine, or comprises a hydrophilic group on one end and a hydrophobic group on the other end. Particularly, the hydrophilic group on the one end may comprise a —OH group or a —COOH group, and the hydrophobic group on the other end may comprise a hydrocarbyl group. The hydrophobic coating additive may comprise trimethylchlorosilane (TMCS), TMSDMA (($CH3$)$_3$SiN($CH3$)$_2$), dimethyldichlorosilane, propyldimethylchlorosilane, alkyltrialkoxysilane, hexadecyltrimethoxysilane, tetraethoxysilane, 3-glycidyloxypropyltrimethoxysilane, and a organosilicon coupling agent $R^aSi(R^b)_nX_{3-n}$, wherein $R^a$ is a $C_{1-24}$ linear or branched alkyl group or $R^a$ is an aromatic group separated from a silicon atom at a distance of 1 to 8 carbon atoms, $R^b$ is a $C_{1-6}$ short linear or branched alkyl group, X is a hydrolyzable group, and n=0, 1, 2. The hydrolyzable group comprises a halogen or an alkoxy group. When a solid surface is treated, one end of the coupling agent reacts with a surface active group and the other end forms a directionally arranged monomolecular layer toward air, and there is a significant water-repelling effect. The hydrophobic coating additive may perform surface treatment or silanization treatment on the surface to be cleaned, and the hydrophobic coating additive comprises a silane agent. In this way, the residue of the modifier may be prevented, as shown in FIG. 5C. Specifically, operations may be performed with reference to embodiments and specific examples described above, and verbose words are omitted herein.

As can be seen, in this example, selective etching of the SiGe surface, i.e., the exposed SiGe surface, is achieved by forming the modified layer several times and etching the modified layer several times, in the case where both the Si surface and the SiGe surface are exposed, on the basis that the rate at which the modified layer is formed on the SiGe surface is greater than the rate at which the modified layer is formed on the Si surface or the rate at which the modified layer formed on the SiGe surface is removed is greater than the rate at which the modified layer formed on the Si surface is removed.

It can be understood by those skilled in the art that the methods as illustrated above are merely exemplary. The method of the present disclosure is not limited to the steps and the orders as illustrated above. Numerous variations and modifications may be made by those skilled in the art according to the teachings of the embodiments illustrated.

Although the present disclosure has been illustrated above in conjunction with preferred embodiments of the present disclosure, it will be understood by those skilled in the art that various modifications, substitutions, and variations may be made to the present disclosure without departing from the spirit and the scope of the present disclosure. Therefore, the present disclosure should not be limited by the embodiments described above, but should be limited by the appended claims and equivalents thereof.

What is claimed is:

1. A selective etching method, comprising:
a step of forming a modified layer having a thickness of one or several atom layers on a selected region of a surface of a semiconductor material layer by using a modifier, wherein the semiconductor material layer comprises Si as a first solid material and SiGe as a second solid material, the selected region includes an exposed surface of the first solid material and an exposed surface of the second solid material, a rate of forming the modified layer on the surface of the second solid material is greater than a rate of forming the modified layer on the surface of the first solid material, so that the modified layer on the surface of the second solid material has a thickness greater than that of the modified layer on the surface of the first solid material; and
a step of removing the modified layer, wherein the modified layer on the surface of the first solid material and the modified layer on the surface of the second solid material are etched simultaneously, until the modified layer on the surface of the second solid material is removed completely.

2. The method according to claim 1, further comprising: after the step of removing the modified layer, at least cleaning a surface, from which the modified layer is removed, by using a second cleaning agent, and/or, after the step of forming a modified layer by using a modifier and before the step of removing the modified layer, at least cleaning a surface, on which the modified layer is formed, by using a first cleaning agent.

3. The method according to claim 2, wherein the first cleaning agent or second cleaning agent comprises water, high-purity deionized water, ethanol, acetone, isopropanol, or a liquid of a combination of several thereof, or argon, helium, nitrogen, hydrogen, water vapor, or a gas of a combination of several thereof.

4. The method according to claim 2, wherein the first cleaning agent or second cleaning agent comprises a mixture of water, high-purity deionized water, ethanol, acetone, isopropanol, or a liquid of a combination of several thereof with a surfactant and/or a hydrophobic coating additive.

5. The method according to claim 4, wherein the surfactant comprises an organic matter, which is an alcohol, an aldehyde, an ester, or an amine, or comprises a hydrophilic group on one end and a hydrophobic group on the other end.

6. The method according to claim 4, wherein the hydrophobic coating additive comprises trimethylchlorosilane, $(CH3)_3SiN(CH3)_2$, propyldimethylchlorosilane, alkyltrialkoxysilane, hexadecyltrimethoxysilane, tetraethoxysilane, 3-glycidyloxypropyltrimethoxysilane, or an organosilicon coupling agent $R^aSi(R^b)_nX_{3-n}$, wherein $R^a$ is a $C_{1-24}$ linear or branched alkyl group or $R^a$ is an aromatic group separated from a silicon atom at a distance of 1 to 8 carbon atoms, $R^b$ is a $C_{1-6}$ short linear or branched alkyl group, X is a hydrolyzable group, and n=0, 1, 2.

7. The method according to claim 6, wherein the hydrolyzable group comprises a halogen or an alkoxy group.

8. The method according to claim 5, wherein the hydrophilic group comprises a —OH group or a —COOH group, and the hydrophobic group comprises a hydrocarbyl group.

9. The method according to claim 1, further comprising: performing the steps of forming a modified layer by using a modifier and removing the modified layer repeatedly until a predetermined thickness of a semiconductor material layer is etched in the selected region.

10. The method according to claim 1, wherein a process of forming the modified layer and a process of removing the modified layer are both isotropic.

11. The method according to claim 1, wherein the modifier reacts with the selected region of the surface of the semiconductor material layer, and an increase rate of a thickness of the modified layer formed decreases as a time of a reaction with the modifier increases at least in a period of time.

12. The method according to claim 11, wherein the reaction is self-limited.

13. The method according to claim 12, wherein the modifier reacts with the selected region of the surface of the semiconductor material layer until a thickness of the modified layer having a thickness of one or several atom layers reaches a saturation thickness.

14. The method according to claim 11, wherein a modified layer formed by a reaction between one or several atom layers in the selected region of the surface of the semiconductor material layer and the modifier prevents a further reaction between the selected region of the surface of the semiconductor material layer and the modifier.

15. The method according to claim 1, wherein etching may be performed with an etching precision of 0.5 nm or less.

16. The method according to claim 1, wherein a rate at which a modified layer formed on a SiGe surface is removed is greater than a rate at which a modified layer formed on a Si surface is removed, so that a part of the modified layer formed on the Si surface still remains when the modified layer formed on the SiGe surface has been completely removed, and the remained modified layer serves as a protective layer for Si.

17. The method according to claim 1, wherein the modified layer comprises an oxide of Si and an oxide of SiGe.

18. The method according to claim 1, wherein the modifier includes a liquid or aqueous solution comprising one or a combination of several of ozone, potassium permanganate, potassium dichromate, nitric acid, sulfuric acid, and hydroperoxide, as well as an oxygen-containing gas or an oxygen-containing plasma.

19. The method according to claim 18, wherein the modified layer is removed by an etching agent, wherein the etching agent comprises hydrofluoric acid, buffered hydrofluoric acid, a mixture of HF and $NH_4F$, hydrofluoric acid vapor, halogen hydride or vapor thereof.

* * * * *